United States Patent [19]

Rostaing et al.

[11] Patent Number: 5,246,768

[45] Date of Patent: Sep. 21, 1993

[54] MULTILAYER COATING FOR POLYCARBONATE SUBSTRATE AND PROCESS FOR PREPARING SAME

[75] Inventors: Jean-Christophe Rostaing, Versailles; François Coeuret, Guyancourt, both of France

[73] Assignee: l'Air Liquid, Societe Anonyme pour l'Etude et l'Exploitation des Procedes Georges Claude, Paris, France

[21] Appl. No.: 694,740

[22] Filed: May 2, 1991

[30] Foreign Application Priority Data

May 2, 1990 [FR] France .................. 90 05529

[51] Int. Cl.$^5$ ................................ B32B 7/02
[52] U.S. Cl. .................... 428/213; 428/216; 428/412; 428/446; 428/447; 428/698; 428/704
[58] Field of Search ........... 428/446, 698, 702, 704, 428/412, 447, 216, 213

[56] References Cited

U.S. PATENT DOCUMENTS

| | | | |
|---|---|---|---|
| 4,239,819 | 12/1980 | Holzl | 428/457 |
| 4,460,669 | 7/1984 | Ogawa et al. | 430/57 |
| 4,485,146 | 11/1984 | Mizuhashi et al. | 428/428 |
| 4,568,614 | 2/1986 | Eichen et al. | 428/450 |
| 4,666,808 | 5/1987 | Kawamura et al. | 430/65 |
| 4,668,365 | 5/1987 | Foster et al. | 428/698 |
| 4,683,186 | 7/1987 | Ohashi et al. | 430/63 |
| 4,737,379 | 4/1988 | Hudgens et al. | 427/39 |
| 4,777,090 | 11/1988 | Ovshinsky et al. | 428/446 |
| 5,116,665 | 5/1992 | Ganthier et al. | 428/216 |

FOREIGN PATENT DOCUMENTS 0289402 2/1988 European Pat. Off. .
0345107 6/1989 European Pat. Off. .

OTHER PUBLICATIONS

Thin Solid Films, vol. 148, No. 3, Apr. 27, 1987, pp. 285-291, Lausanne CH; J. E. Schoenholtz et al "Plasma-enhanced deposition of silicon oxynitride films".

Primary Examiner—A. A. Turner
Attorney, Agent, or Firm—Browdy and Neimark

[57] ABSTRACT

Multilayer coating for polycarbonate substrate used as glass substitute essentially consisting of silicon, carbon, nitrogen, oxygen and hydrogen, characterized by a first anti-ultra-violet layer consisting of silicon, oxygen and/or nitrogen, carbon and hydrogen, according to formula:

$$SiC_{x_1}O_{z_1}Ht_1,$$

where $x_1+z_1+t_1$ is between 1,2 and 1,5

$$SiC_{x_1}N_{y_1}Ht_1,$$

where $x_1+y_1+t_1$ is between 1,2 and 1,5

$$SiC_{x_1}N_{y_1}O_{z_1}Ht_1,$$

where $x_1+y_1+z_1+t_1$ is between 1,2 and 1,4 and $t_1$ is always between 0,1 and 0,7; $x_1$ before $y_1$ and/or $z_1$ is small, so that the limit of optical absorption is concentrated at about 350 nm; the second transparent hard layer consists of silicon, oxygen, nitrogen, carbon and hydrogen, of formula $SiC_{x_2}N_{y_2}O_{z_2}Ht_2$, where, in particular:

either $y_2=0$, $z_2$ is between 1,7 and 2,0, $t_2$ is between 0,1 and 0,7, $x_2$ before $z_2$ is small;

or $y_2$ is between 1,0 and 1,3, $t_2$ is between 0,1 and 0,7, $x_2$ and $z_2$ before $y_2$ are small.

The invention finds application in the protection of polycarbonate against aging caused by ultra-violet radiation, in particular for glasses of automobile headlights, spectacle glasses.

14 Claims, 1 Drawing Sheet

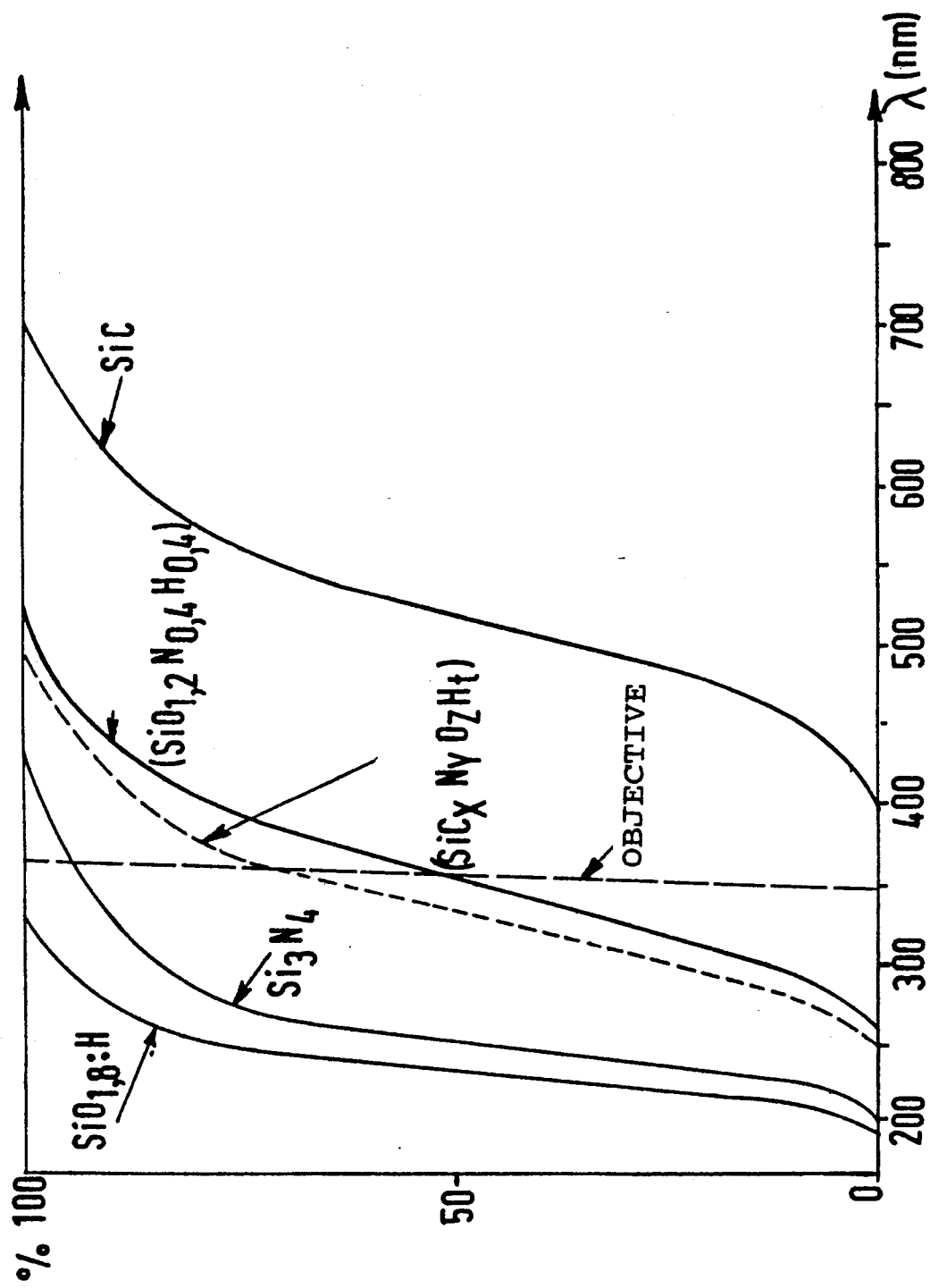

MULTILAYER COATING FOR POLYCARBONATE SUBSTRATE AND PROCESS FOR PREPARING SAME

The present invention concerns multilayer coatings for polycarbonate substrates used as glass substitutes, to manufacture glasses for automobile headlights, spectacle glasses, etc. . . . Polycarbonate is however very sensitive to ultra-violet radiation and, when it is exposed to a high pressure xenon lamp (continuous emission of 140 to more than 400 nm), it yellows, cracks and undergoes a very accelerated aging.

For applications as lenses for automobile headlights, polycarbonate is generally covered with a hard protective varnish which is composed of two layers each having a particular function:

an anti-ultra-violet layer which is intended to block, as much as possible, all radiations having a wavelength lower than 350 nm;

a hard protective layer.

It has already been proposed in the document FR-A-2.614.317, corresponding to U.S. Pat. No. 5,093,152, to prepare these protective deposits from silicon and oxygen and/or nitrogen and/or hydrogen with gas precursors of these elements, such as a silane, $O_2$, $N_2O$, $N_2$, $NH_3$, in the presence of a plasma and, in the document FR-A-2.631.346, corresponding to U.S. Pat. No. 5,116,665, to produce layers of formula $SiC_xN_yO_zHt$ where, for the first layer, x is between 0 and 0.5, y is between 0 and 0.15, z between 0.4 and 1 and t is between 0.6 and 1.2 while for the second layer, x' is between 0 and 5, y' is between 0.3 and 0.8, z' is between 1.3 and 2.5 and t' is between 0.5 and 1.2. These documents are understood to be incorporated herein by reference.

However, it has been found that such layers, such as the hard layer, may become degraded when they are subjected to the radiation of a high pressure xenon lamp. This degradation results in a loosening of the deposits and yellowing of the polycarbonate. This defect can be explained by the degradation of the deposit per se, and/or the degradation of the polymer (production of cracks causing stresses in the deposit) and/or a deterioration of the interface (decrease of the adhesion).

The hard deposits of silicon oxynitrides produced by CVD-plasma without willful introduction of carbon, have a composition of the type $SiC_xN_yO_zHt$, where x is small (carbon originating only from the polycarbonate substrate or the atmosphere) and contain few Si-Si bonds. These alloys have optical properties which are near those of a physical mixture $Si_3N_4/SiO_2$ and in particular allow for the complete passage of ultra-violet radiation below 350 nm, as shown in the curve in dotted line of the annexed figure, where the coefficient of transmission T (percentage) is given in the ordinate for various wavelengths (nm) in the abscissae.

A BRIEF DESCRIPTION OF THE DRAWING

As indicated immediately above, the sole FIGURE is a graph showing various curves of Si alloys wherein the coefficient of transmission T as percentage is plotted against various wavelengths.

The present invention aims at a layer of this type which can be produced by PECVD ("plasma enhanced chemical vapor deposition"), according to the process mentioned above which blocks wavelength radiations lower than 350 nm, and in a clearly more sudden manner, as indicated by the broken line indicated objective on the figure and this object of the invention is achieved by means of a first anti-ultra-violet layer consisting of silicon, oxygen and/or nitrogen, carbon and hydrogen, according to formula:

$SiC_{x_1}O_{z_1}H_{t_1}$, or $SiC_{x_1}N_{y_1}H_{t_1}$, or $SiC_{x_1}N_{y_1}O_{z_1}H_{t_1}$ where $x_1 + y_1 + z_1 + t_1$ is between 1.2 and 1.5;

$t_1$ is between 0.1 and 0.7, $x_1$ is small compared to $y_1$ and/or $z_1$.

By "$x_1$ is small", it is understood that the physical properties of the layer, and especially its optical properties, are substantially independent of the incorporation of carbon.

This first layer is covered with a second transparent hard layer consisting of silicon, oxygen, nitrogen, carbon and hydrogen.

The composition of this hard layer may be within the limits given in the document FR-A-2.631.346 mentioned above, but is advantageously within the following ranges:

| | | |
|---|---|---|
| $SiC_{x_2}N_{y_2}O_{z_2}H_{t_2}$ with | $y_2$ | between 1.0 and 1.3, |
| | $t_2$ | between 0.1 and 0.7, |
| | $x_2$ | and $z_2$ before $y_2$ are small; |
| $SiC_{x_2}O_{z_2}H_{t_2}$ with | $z_2$ | between 1.7 and 2.0, |
| | $t_2$ | between 0.1 and 0.7, |
| | $x_2$ | before $z_2$ is small |

Experience shows that the object is achieved by the invention, whose physical principle may be explained in the following manner: the optical absorption of the amorphous alloys of silicon, under high energy, increases rapidly (approximately parabolic in function of the photon energy $h\nu$). The limit of this so called high absorption zone is in the vicinity of the value of the prohibited optical band $E_g$ of the material and depends mainly of the chemical composition of the latter. More particularly, $E_g$ is exclusively a function, of the first order, of the relative number of bonds Si-Si in the material, or still of the parameter $x_1+y_1+z_1+t_1$. The value of this parameter can be adjusted with great flexibility in a plasma assisted process of preparation of a deposit CVD, by simply modifying the relative flows of the various gases and the other parameters used for the preparation. The value $E_g$ is therefore adjusted so that the deposit of a thin film has a negligible transmission for wavelengths lower than a given value, for example in the vicinity of 350 nm in the present case.

In practice, the spectrum transition region between transparency and very high absorption ($>10^4$ cm$^{-1}$) should be made sufficiently narrow. Indeed, the wavelengths lower than about 350 nm should be highly absorbed, but the layer should remain substantially transparent for the visible wavelengths which are immediately adjacent in the spectrum (violet-blue). In the opposite case, a yellow color appears which is absolutely unacceptable for most applications.

The function of transmission of the thin layer deposited on a transparent substrate depends not only on the coefficient of absorption, but also on the thickness of the layer, as well as on the optical indices of the substrate and the other transparent layers constituting the protective coating.

In particular, the transition between near transparency and near zero transmission is more important when the thickness of the absorbing layer is high, but this thickness should obviously be limited in practice. The practice of the present invention is advantageously carried out so that the thickness of the first anti-ultraviolet layer is of the order of a micron, while the thickness of the second transparent hard layer is of the order of 2 to 4 microns. Advantageously, there is provided a bonding layer between a polycarbonate substrate and the first anti-ultra-violet layer, which is carried out from silane and the plasma producing argon gas, according to the process described in the document FR-A-2.631.346, and, whose thickness is about 100 Angströms.

The invention is therefore also concerned with a process for the preparation of a multi-layer coating, characterized in that there is successively provided on a polycarbonate support first a plasma pre-treatment, preferably an argon-ammonia plasma, then a bonding layer based on $SiH_4$ is deposited, after which there is deposited by plasma PECVD, first and second layers from $SiH_4$, $O_2$ and/or $N_2$, the latter possibly with a gas carrying carbon.

Various embodiments of the invention will now be described:

EXAMPLE 1

A first method for modifying the prohibited optical band consists in preparing by PECVD a hydrogenated oxide which is slightly carburized $SiC_{x1}O_{z1}Ht_1$ with $x<2$, in fact $x_1+z_1+t_1$ between 1.2 and 1.5, $t_1$ between 0.1 and 0.7, $x_1$ small with respect to $z_1$ so as to decrease the width of the prohibited optical band with respect to that of the stoichiometric material $SiO_2$ by producing Si-Si bonds. However, these sub-stoichiometric oxides have a low degree of hardness which makes them unsuitable to simultaneously ensure the function of mechanical protection. The anti-ultra-violet layer should therefore be covered with a transparent hard layer. Experimentally, it is observed that a thickness of about 1 μm for the anti-ultra-violet layer is sufficient to ensure a sudden transition. The increase of the total thickness of the structure therefore remains within reasonable limits, for example with respect to problems of stresses.

The operation is as follows:
pre-treatment by plasma $Ar/NH_3$;
bonding layer deposited from $SiH_4$ according to the patent application mentioned, of a thickness of about 100 Angströms;
anti-ultra-violet layer of $SiC_{x1}O_{z1}Ht_1$ with $x_1+z_1+t_1$ between 1.2 and 1.5; $t_1$ between 0.1 and 0.7, $x_1$ small with respect to $z_1$, deposited from $SiH_4$ and $O_2$ in addition to Ar plasma producing gas, according to the same process, of a thickness of about 1 micron;
hard layer according to the mentioned process, of a thickness of 3 to 4 microns deposited from $SiH_4$, $O_2$ and/or $N_2$, and possibly a gas carrying carbon.

EXAMPLE 2

The anti-ultra-violet layer may also be prepared with a material consisting of hydrogenated silicon nitride, which is slightly carburized, in sub-stoichiometric amount with respect to $Si_3N_4$, i.e. $Si Cx_1Ny_1Oz_1Ht_1$ with $x_1+y_1+z_1+t_1$ is between 1.2 and 1.5, $t_1$ is between 0.1 and 0.7, $x_1$ and $z_1$ before $y_1$ are small.

This material is deposited from $SiH_4$ and $N_2$.

Experience has shown that this type of material is particularly resistant during accelerated tests of aging under very high density of radiation UV.

The operation is the same as in the previous example.

EXAMPLE 3

For certain applications, it may be useful to vary other properties of the anti-ultra-violet layer, for example the refraction index within the region of transparency, while substantially keeping constant the value of the prohibited optical band $E_g$ (i.e., in practice, the limit of cutting UV).

For this purpose, it is possible to vary the relative incorporations of nitrogen and oxygen in a hydrogenated oxynitride of silicon, which is slightly carburized, prepared from the three gases $SiH_4$, $O_2$ and $N_2$ according to the mentioned process, by utilising different values of the ratio of gaseous flows $(O_2)/(N_2)$. There is thus obtained a material of the formula:

$SiC_{x1}N_{y1}O_{z1}Ht_1$ with $x_1+y_1+z_1+t_1$ between 1.2 and 1.5, $t_1$ between 0.1 and 0.7, $x_1$ small before $y_1$ and/or $z_1$.

The operation is identical to that of the previous example.

By way of comparison, samples of the different types described above are exposed to the radiation of a 5 W laboratory UV lamp, radiating at about 365 nm. No visible alteration is noted after 3000 hours of continuous exposure.

The samples of polycarbonate coated with the single combination adhesion layer + hard layer, without anti-UV layer, show a substantial delamination of the protective film after an average of less than 20 hours.

The invention finds application in all the fields where a protection of the polycarbonate against aging due to ultra-violet radiation is required, in particular for the glasses of automobile headlights, spectacle glasses.

The invention is not limited to the embodiments given by way of examples and is capable of modifications and variants which will be obvious to one skilled in the art. Thus, depending on uses, there will be advantageously provided, between the initial step of plasma pre-treatment of the substrate and the step of production of the bonding layer, a step of plasma deposit of a sub-layer of silica with a thickness lower than 1 μm.

We claim:

1. A coating for a polycarbonate substrate used as a glass substitute, comprising:
   an inner bonding layer of silicon-based material;
   an intermediate anti-UV silicon-based layer above said inner bonding layer, said anti-UV layer having the formula:

$SiC_{x1}N_{y1}O_{z1}H_{t1}$ wherein
   $x_1+y_1+z_1+t_1$ is between 1.2 and 1.5,
   $t_1$ is between 0.1 and 0.7,
   $x_1$ is small relative to $y_1$ or $z_1$,
   and an outer hard transparent silicon-based layer of the formula:

$SiC_{x2}N_{y2}O_{z2}H_{t2}$ wherein
   $y_2$ is between 1.0 and 1.3,
   $t_2$ is between 0.1 and 0.7,
   $x_2$ and $z_2$ are small relative to $y_2$.

2. The coating of claim 1, wherein said inner bonding layer of silicon-based material has a thickness of about 100 Ångströms.

3. The coating of claim 2, wherein the thickness of the intermediate anti-UV layer is less than the thickness of the outer layer.

4. The coating of claim 3, wherein the thickness of the intermediate anti-UV layer is about 1 micron.

5. A coating for a polycarbonate substrate used as a glass substitute, comprising:
an inner bonding layer of silicon-based material;
an intermediate anti-UV silicon-based layer above said inner bonding layer, said anti-UV layer having the formula:

$$SiC_{x1}N_{y1}O_{z1}H_{t1}$$

wherein
$x_1 + y_1 + z_1 + t_1$ is between 1.2 and 1.5,
$t_1$ is between 0.1 and 0.7,
$x_1$ is small relative to $y_1$ or $z_1$,
and an outer hard transparent silicon-based layer of the formula:

$$Si\ C_{x2}O_{z2}H_{t2}$$

wherein
$z_2$ is between 1.7 and 2,
$t_2$ is between 0.1 and 0.7,
$x_2$ is small relative to $z_2$.

6. The coating of claim 5, wherein said inner bonding layer of silicon-based material has a thickness of about 100 Ångströms.

7. The coating of claim 6, wherein the thickness of the intermediate anti-UV layer is less than the thickness of the outer layer.

8. The coating of claim 7, wherein the thickness of the intermediate anti-UV layer is about 1 micron.

9. A coated body comprising a transparent polymeric substrate with a surface having a bonding layer thereon and at least first and second layers of silicon-based materials superimposed on the bonding layer, the first layer having a first thickness and the second outer layer having a second thickness greater than the first thickness, wherein the first layer has one of the following formulas:

$Si\ C_{x1}O_{z1}H_{t1}$, with $x_1 + z_1 + t_1$ between 1.2 and 1.5,
$Si\ C_{x1}N_{y1}H_{t1}$, with $x_1 + y_1 + t_{1d}$ between 1.2 and 1.5,
$Si\ C_{x1}N_{y1}O_{z1}H_{t1}$, with $x_1 + y_1 + z_1 + t_1$ between 1.2 and 1.5, $t_1$ being between 0.1 and 0.7,
$x_1$ being small relative to any of $y_1$ and $z_1$,
so that the limit of optical absorption of the first layer is centered around 350 nm,
the second layer has a formula:

$$Si\ C_{x2}N_{y2}O_{z2}H_{t2}$$

wherein
$y_2$ is between 1.0 and 1.3,
$t_2$ is between 0.1 and 0.7,
$x_2$ and $z_2$ are small relative to $y_2$.

10. The coated body of claim 9 wherein said bonding layer comprises a silicon-based material and has a third thickness less than the first thickness.

11. The coated body of claim 10, further comprising a sublayer of silicon between the bonding layer and the surface, the sublayer having a thickness less than the second thickness.

12. A coated body comprising a transparent polymeric substrate with a surface having a bonding layer thereon and at least first and second layers of silicon-based materials superimposed on the bonding layer, the first layer having a first thickness and the second outer layer having a second thickness greater than the first thickness, wherein the first layer has one of the following formulas:

$SiC_{x1}O_{z1}H_{t1}$, with $x_1 + z_1 + t_1$ between 1.2 and 1.5,
$SiC_{x1}N_{y1}H_{t1}$, with $x_1 + y_1 + t_1$ between 1.2 and 1.5,
$SiC_{x1}N_{y1}O_{z1}H_{t1}$, with $x_1 + y_1 + z_1 + t_1$ between 1.2 and 1.5, $t_1$ being between 0.1 and 0.7,
$x_1$ being small relative to any of $y_1$ and $z_1$,
so that the limit of optical absorption of the first layer is centered around 250 nm,
the second layer has a formula:

$$SiC_{x2}N_{y2}O_{z2}H_{t2}$$

wherein
$z_2$ is between 1.7 and 2,
$t_2$ is between 0.1 and 0.7 and
$x_2$ is small relative to $z_2$.

13. The coated body of claim 12, wherein said bonding layer comprises a silicon-based material and has a third thickness less than the first thickness.

14. The coated body of claim 13, further comprising a sublayer of silicon between the bonding layer and the surface, the sublayer having a thickness less than the second thickness.

* * * * *